(12) United States Patent
Wollitzer

(10) Patent No.: US 7,880,294 B2
(45) Date of Patent: Feb. 1, 2011

(54) POTENTIAL-FREE HOUSING LEADTHROUGH

(75) Inventor: Michael Wollitzer, Fridolfing (DE)

(73) Assignee: Rosenberger Hochfrequenztechnik GmbH & Co. KG, Fridolfing (DE)

( * ) Notice: Subject to any disclaimer, the term of this patent is extended or adjusted under 35 U.S.C. 154(b) by 244 days.

(21) Appl. No.: 12/251,831

(22) Filed: Oct. 15, 2008

(65) Prior Publication Data

US 2009/0032934 A1 Feb. 5, 2009

Related U.S. Application Data

(63) Continuation of application No. PCT/EP2007/002472, filed on Mar. 20, 2007.

(30) Foreign Application Priority Data

Apr. 20, 2006 (DE) .................. 20 2006 006 359 U

(51) Int. Cl.
*H01L 23/04* (2006.01)

(52) U.S. Cl. .............................. 257/698; 257/E23.161; 257/99; 257/678; 385/49; 385/94; 438/106

(58) Field of Classification Search .......... 257/E23.181, 257/E25.02, E33.056, 678, 684, 698, 700, 257/713, 730, 99; 438/106, 117, 121; 385/49, 385/88, 94

See application file for complete search history.

(56) References Cited

U.S. PATENT DOCUMENTS

| | | | | |
|---|---|---|---|---|
| 4,769,684 A | * | 9/1988 | Crocker et al. ................. | 257/99 |
| 5,666,449 A | * | 9/1997 | Sawae et al. ................... | 385/49 |
| 6,054,676 A | * | 4/2000 | Wall et al. ..................... | 219/209 |
| 6,929,407 B2 | * | 8/2005 | de Lacy et al. ................. | 385/92 |
| 7,275,937 B2 | * | 10/2007 | Ellison .......................... | 439/67 |
| 7,507,034 B2 | * | 3/2009 | Moore et al. ................... | 385/88 |
| 7,549,805 B2 | * | 6/2009 | Takizawa et al. .............. | 385/92 |
| 7,629,537 B2 | * | 12/2009 | Ice .............................. | 174/254 |
| 2004/0062491 A1 | * | 4/2004 | Sato et al. ...................... | 385/88 |
| 2006/0062526 A1 | * | 3/2006 | Ikeuchi ......................... | 385/88 |

FOREIGN PATENT DOCUMENTS

GB 2308511 A 6/1997
WO WO 0016344 A1 3/2000

* cited by examiner

*Primary Examiner*—Chris Chu
(74) *Attorney, Agent, or Firm*—Robert Curcio; DeLio & Peterson, LLC

(57) ABSTRACT

The invention relates to a circuit arrangement with an electronic circuit on a printed circuit board and an electrically screening housing surrounding the circuit board, wherein there are on said circuit board a HF plug-and-socket connector connected to the electronic circuit with an outer conductor part and an inner conductor part, wherein the HF plug-and-socket connector penetrates through an opening in the housing. The outer conductor part of the HF plug-and-socket connector is electrically isolated from the housing, and wherein a tunnel-like screening sleeve surrounds the outer conductor part both axially and circumferentially at least partially, the sleeve being connected electrically to the housing and capacitively to the outer conductor part of the HF plug-and-socket connector.

19 Claims, 9 Drawing Sheets

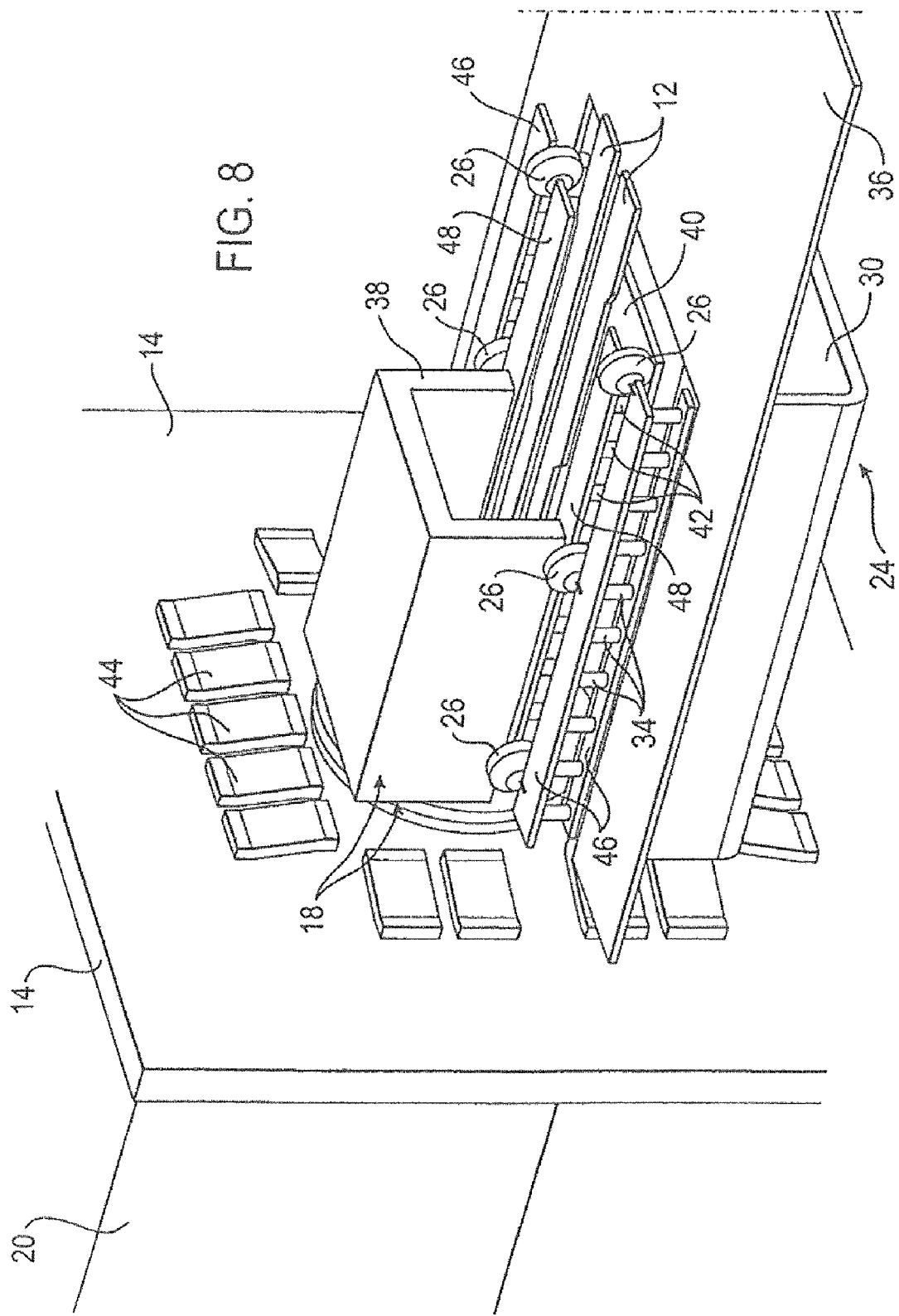

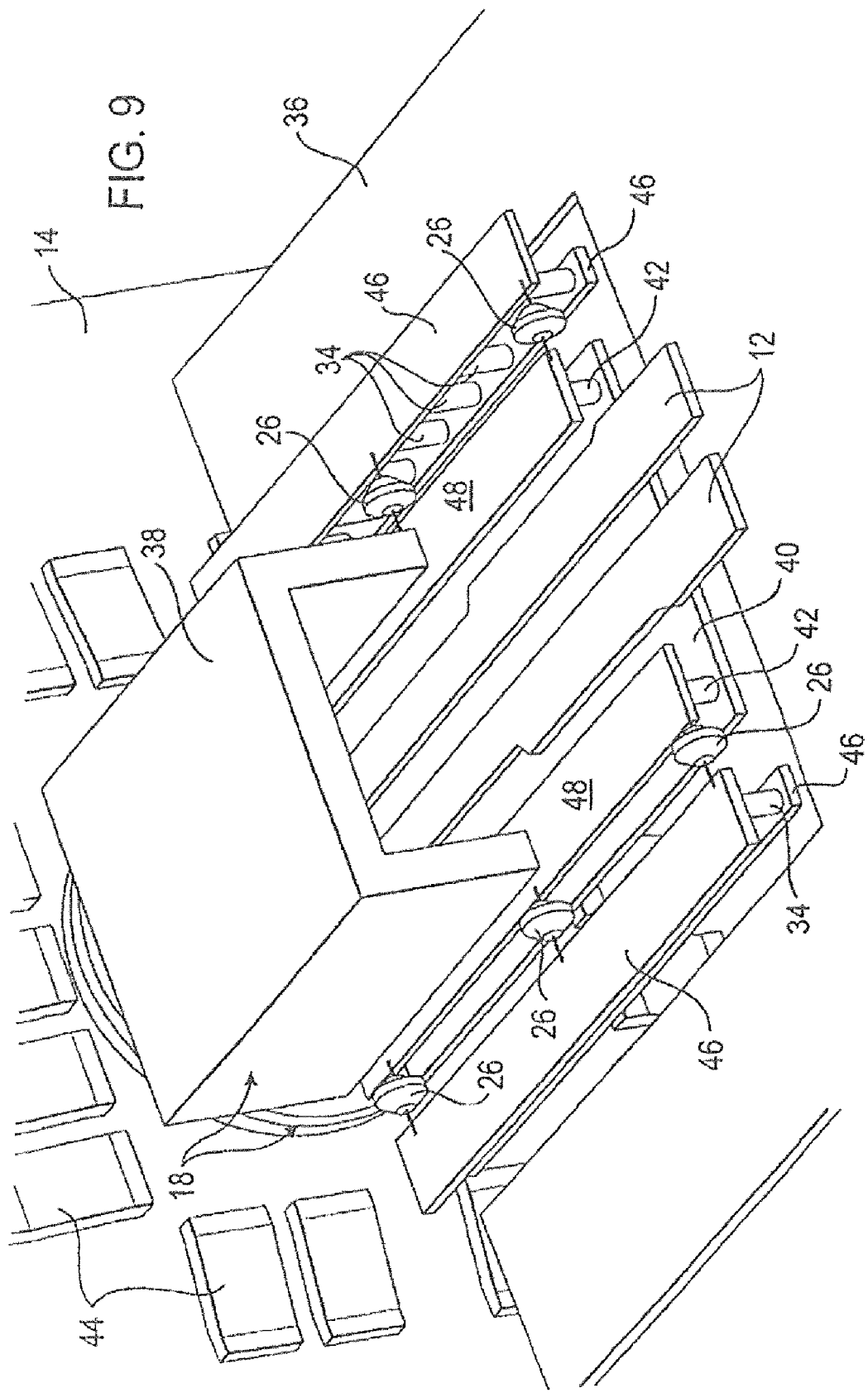

POTENTIAL-FREE HOUSING LEADTHROUGH

This application is a continuation of PCT/EP2007/002472, filed on Mar. 20, 2007, and claims priority from German Application No. DE 20 2006 006 359.5, filed on Apr. 20, 2006.

BACKGROUND OF THE INVENTION

1. Field of the Invention

The present invention relates to a circuit arrangement having an electronic circuit arranged on a printed circuit board and having a housing which surrounds and screens the printed circuit board, there being arranged on the printed circuit board an HF plug or socket connector which is connected to the electronic circuit and which has an outer-conductor part and a center-conductor part, with the HF plug or socket connector passing through an opening in the housing, as specified in the preamble to claim 1.

2. Description of Related Art

When two or more electrical circuits arranged in respective screening housings are connected together by at least one cable having a signal conductor and a screen, it is known for the screen of the cable to be directly connected electrically to both or all of the housings in order to give uninterrupted screening against the entry and the emergence of high-frequency signals in relation to the signal conductors and the housings. However, when this is done, the problem arises that, due to the electrically conductive connection between the two or all the housings via the screen of the cable, an unwanted current flows through the screen of the cable as a result of differences in potential between the housings. Also, this arrangement is not possible when the electrical circuits to be connected have to be at different earth potentials, as this will undoubtedly cause a flow of parasitic current on the screen of the cable. Hence the earth potentials of the two electrical circuits to be connected cannot be kept different. In cases like these, it is therefore necessary for the screen of the cable to be directly connected electrically to only one of the housings and to be electrically isolated from, or in other words free of direct contact with, the other housing or housings. However, this creates the problem that there is necessarily a break in the screening at the point where the cable, or a corresponding cable connector or plug or socket connector connected to the electrical circuit, passes into a housing to which the screen of the cable is not connected.

SUMMARY OF THE INVENTION

Bearing in mind the problems and deficiencies of the prior art, it is therefore an object of the present invention to provide a circuit arrangement of the above-mentioned kind which has a potential-free signal connection which effectively prevents high-frequency signals from emerging from the signal conductor or the housing in an unwanted way and which likewise effectively prevents external high-frequency signals from entering the signal conductor or the housing in an unwanted way.

This object is achieved in accordance with the invention by a circuit arrangement of the above-mentioned kind which has the features characterized in claim 1. Advantageous embodiments of the invention are described in the other claims.

Still other objects and advantages of the invention will in part be obvious and will in part be apparent from the specification.

The above and other objects, which will be apparent to those skilled in the art, are achieved in the present invention which is directed to a circuit arrangement having an electronic circuit arranged on a printed circuit board having a housing which surrounds and electrically screens the printed circuit board, there being arranged on the printed circuit board an HF plug or socket connector which is connected to the electronic circuit and includes an outer-conductor part and a center-conductor part, with the HF plug or socket connector passing through an opening in the housing, the outer-conductor part of the HF plug or socket connector including being isolated from the housing by not being directly connected thereto, the HF plug or socket connector including a screening sleeve being provided which at least partly surrounds the outer-conductor part in a tunnel-like form both in the axial direction and also in the circumferential direction and which is directly connected to the housing and includes a capacitive connection to the outer-conductor part of the HF plug or socket connector.

The printed circuit board may include a system earth which is isolated from the housing by not being directly connected thereto. The center-conductor part may include a direct or capacitive connection to at least one printed signal conductor of the electrical circuit on the printed-circuit board.

The capacitive connection between the screening sleeve and the outer-conductor part of the HF plug or socket connector may comprise a plurality of capacitors which are each connected on the one hand to the screening sleeve and on the other hand to the outer-conductor part of the HF plug or socket connector while being spaced away from one another.

The center-conductor part of the HF plug or socket connector includes two signal conductors. The screening sleeve may be in the form of a tunnel-like folding-round of the housing.

The screening sleeve may comprise at least one first U-shaped component and at least one first metallization which is applied to a side of the printed circuit board which is remote from the first U-shaped component, the first U-shaped component being connected to the first metallization by first through-contacts which pass through the printed circuit board.

The printed circuit board may include, on one side, at least one second metallization which forms the system earth of the printed circuit board and which is isolated from the first metallization by not being directly connected thereto.

The outer-conductor part of the HF plug or socket connector may include being at least partly formed by at least one second U-shaped component and at least one metal layer formed in the printed circuit board, the second U-shaped component being connected to the metal layer by through-contacts arranged in the printed circuit board and the metal layer being so arranged in the printed circuit board that it is arranged between the first metallization and the first U-shaped component of the screening sleeve.

The screening sleeve may comprise at least two first U-shaped components which are arranged on opposite sides of the printed circuit board, the first U-shaped components being connected to one another by first through-contacts which pass through the printed circuit board.

The outer-conductor part of the HF plug or socket connector may be at least partly formed by at least one second U-shaped component and at least one metal layer formed in the printed circuit board, the second U-shaped component being connected to the metal layer by second through-contacts arranged in the printed circuit board and the metal layer being so arranged in the printed circuit board that it is arranged between the first U-shaped components of the screening sleeve.

The printed circuit board may include, on one side, at least one second metallization which forms a system earth for the printed circuit board and which is isolated from the first U-shaped components by not being directly connected thereto.

The HF plug or socket connector may be designed for connection to a plug or socket connector on a signal cable at an end which is remote from the printed circuit board and which projects out of the housing.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 8 is a further perspective view in section of the third preferred embodiment of circuit arrangement according to the invention as shown in FIG. 6, with the printed circuit board and a top part of a screening sleeve omitted.

FIG. 9 is a further perspective view in section of the third preferred embodiment of circuit arrangement according to the invention as shown in FIG. 6, with the printed circuit board and a top part of a screening sleeve omitted.

DESCRIPTION OF THE PREFERRED EMBODIMENT(S)

Figure 1:
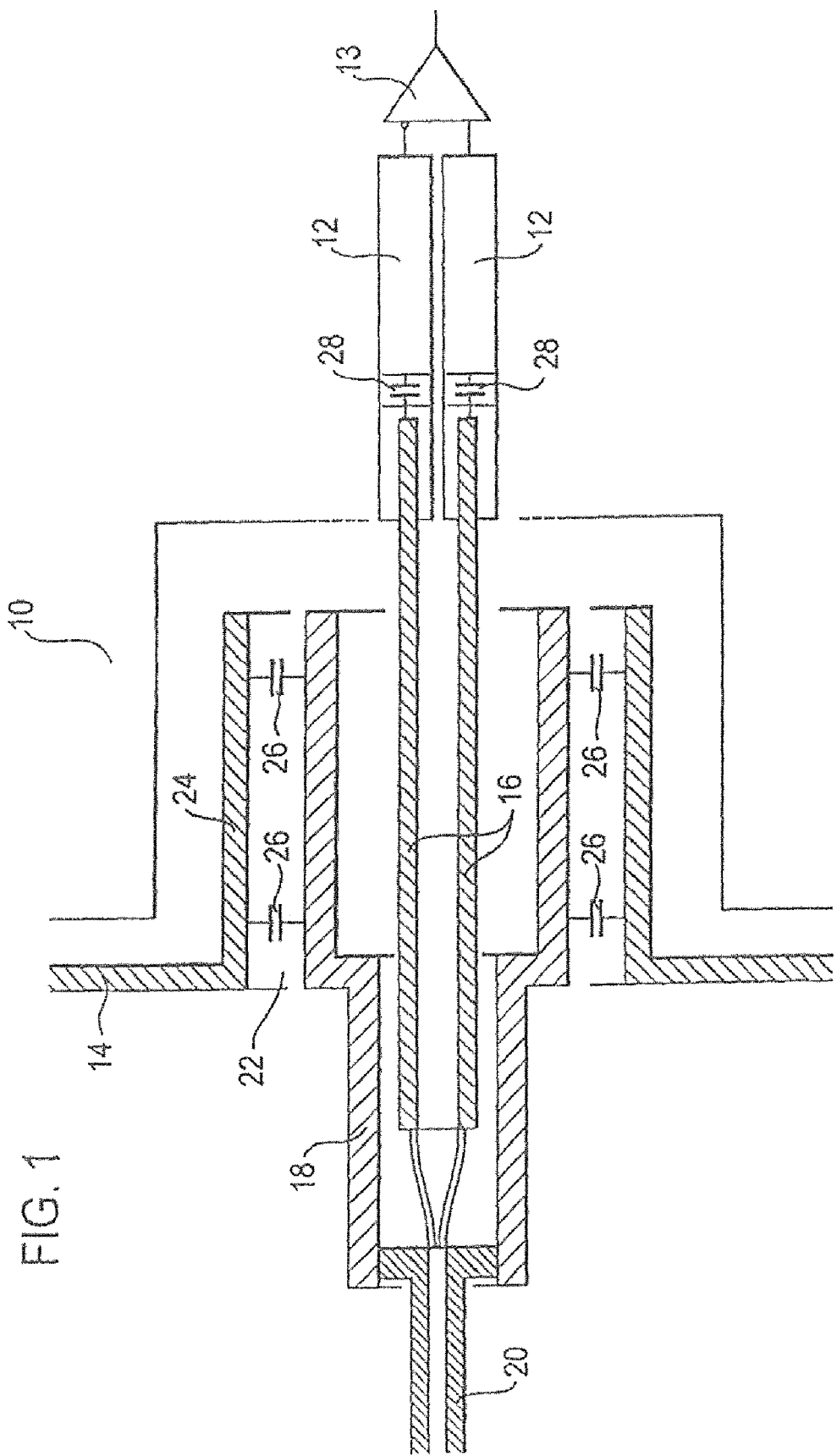
FIG. 1 is a schematic view in section of a first preferred embodiment of circuit arrangement according to the invention.
Figure 2:
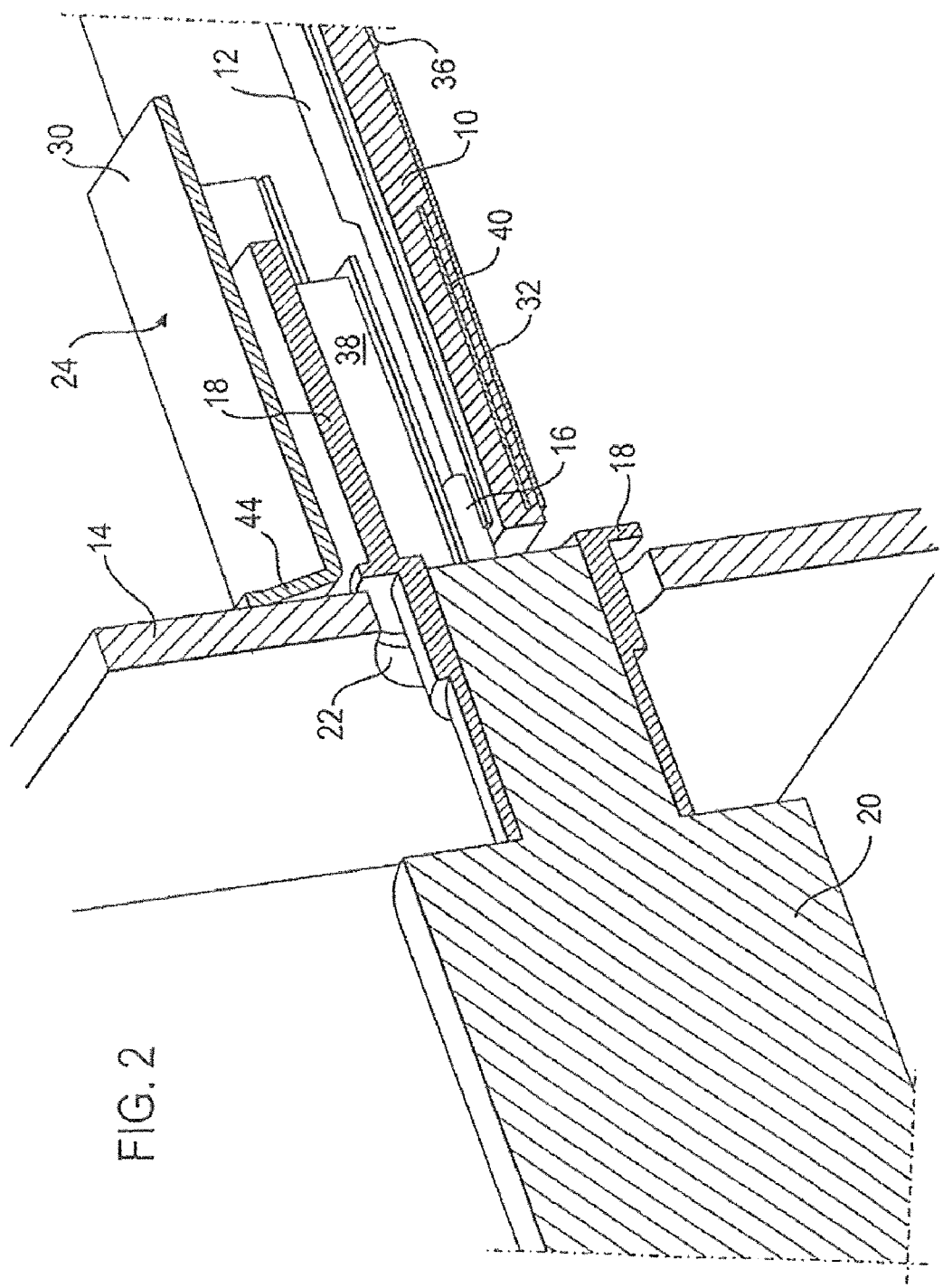
FIG. 2 is a perspective view in section of a second preferred embodiment of circuit arrangement according to the invention.
Figure 3:
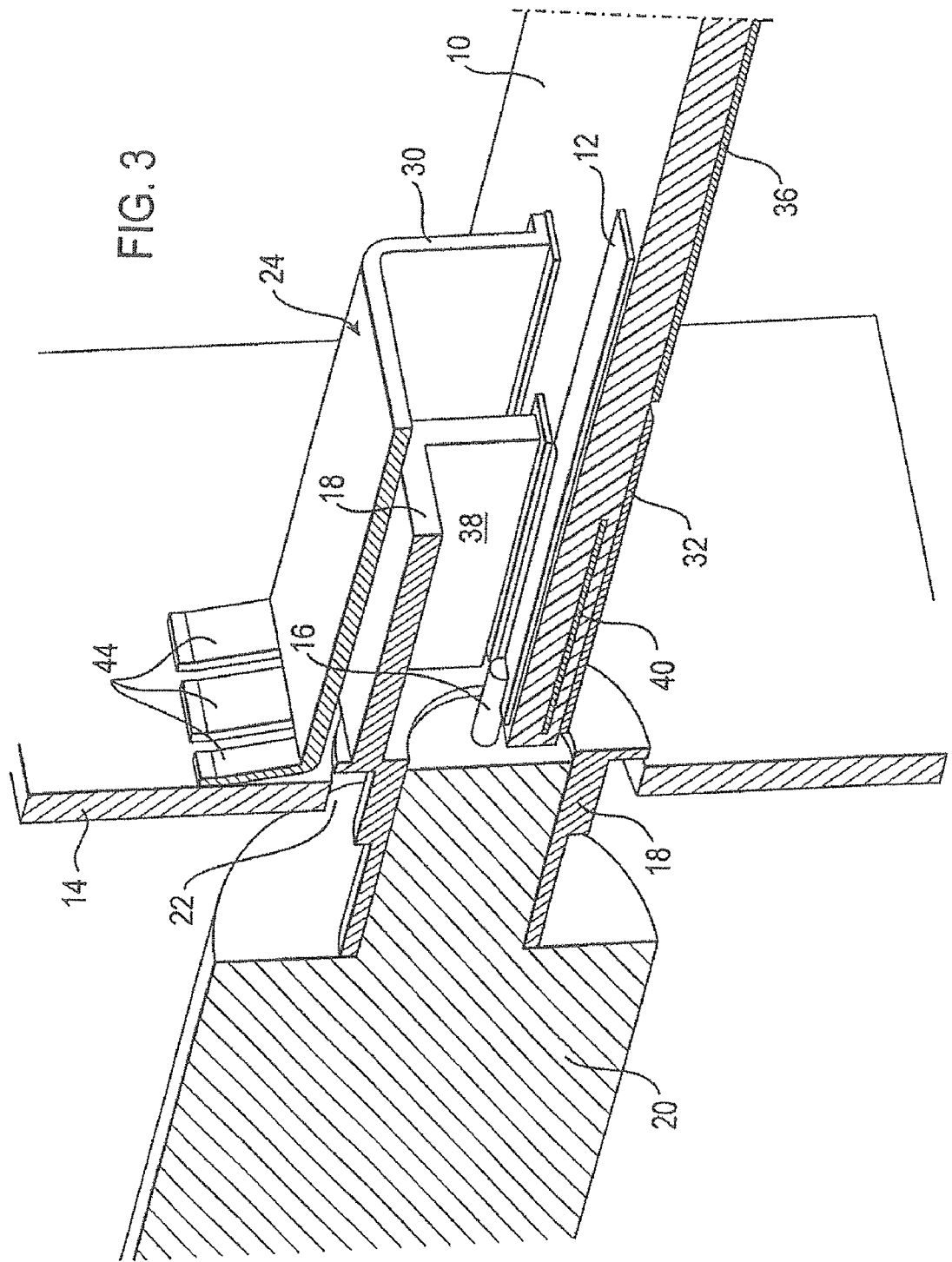
FIG. 3 is a further perspective view in section of the second preferred embodiment of circuit arrangement according to the invention as shown in FIG. 2.

In describing the preferred embodiment of the present invention, reference will be made herein to FIGS. 1-9 of the drawings in which like numerals refer to like features of the invention.

In a circuit arrangement of the above-mentioned kind, provision is made in accordance with the invention for the outer-conductor part of the HF plug or socket connector to be isolated from the housing by not being directly connected thereto, a screening sleeve being provided which at least partly surrounds the outer-conductor part in a tunnel-like form both in the axial direction and also in the circumferential direction and which is directly connected to the housing and capacitively connected to the outer-conductor part of the HF plug or socket connector.

This has the advantage that, despite the fact that there is a physical break in the screening in the region where the HF plug or socket connector passes through the housing, any coupling-in or coupling-out of HF signals is prevented because such signals are short-circuited to the housing by means of the capacitive coupling of the outer-conductor part and higher-order modes decay exponentially in the tunnel-like screening sleeve.

The printed circuit board usefully has a system earth, which is isolated from the housing by not being directly connected thereto.

For the transmission of signals from the center-conductor part to the electronic circuit on the printed circuit board, the center-conductor part is directly or capacitively connected to at least one printed signal conductor of the electrical circuit on the printed-circuit board.

In a preferred embodiment, the capacitive connection between the screening sleeve and the outer-conductor part of the HF plug or socket connector comprises a plurality of capacitors which are each connected on the one hand to the screening sleeve and on the other hand to the outer-conductor part of the HF plug or socket connector while being spaced away from one another.

To allow a differential signal to be transmitted, the center-conductor part of the HF plug or socket connector has two signal conductors.

The screening sleeve is in the form of a tunnel-like folding-round of the housing.

In an illustrative embodiment, the screening sleeve comprises at least one first U-shaped component and at least one first metallization which is applied to a side of the printed circuit board which is remote from the first U-shaped component, the first U-shaped component being connected to the first metallization by first through-contacts which pass through the printed circuit board. The printed circuit board has for example, on one side, at least one second metallization which forms the system earth of the printed circuit board and which is electrically isolated from the first metallization. The outer-conductor part of the HF plug or socket connector is, in this case, preferably at least partly formed by at least one second U-shaped component and at least one metal layer formed in the printed circuit board, the second U-shaped component being connected to the metal layer by through-contacts arranged in the printed circuit board and the metal layer being so arranged in the, printed circuit board that it is arranged between the first metallization and the first U-shaped component of the screening sleeve.

In an alternative embodiment, the screening sleeve comprises at least two first U-shaped components which are arranged on opposite sides of the printed circuit board, the first U-shaped components being connected to one another by first through-contacts which pass through the printed circuit board. The outer-conductor part of the HF plug or socket connector is at least partly formed by at least one second U-shaped component and at least one metal layer formed in the printed circuit board, the second U-shaped component being connected to the metal layer by second through-contacts arranged in the printed circuit board and the metal layer being so arranged in the printed circuit board that it is arranged between the first U-shaped components of the screening sleeve. The printed circuit board has, on one side, at least one second metallization which forms a system earth for the printed circuit board and which is isolated from the first U-shaped components by not being directly connected thereto.

At an end which is remote from the printed circuit board and which projects out of the housing, the HF plug or socket connector is designed for connection to a plug or socket connector on a signal cable.

The first preferred embodiment of circuit arrangement according to the invention which is shown in FIG. 1 comprises a printed circuit board 10 having an electronic circuit made up of appropriate printed conductors and components, of which only two printed signal conductors 12 arranged on the printed circuit board 10 and one amplifier component 13 are shown, and comprises a screening housing 14 and an HF plug or socket connector which has a center-conductor part 16 and an outer-conductor part 18. In the illustrative embodiment shown, the HF plug or socket connector is designed for the transmission of differential signals on two signal conductors and for connection to a corresponding signal cable 20. The HF plug or socket connector extends through an opening 22 in the housing 14. To allow the housing to perform its screening function, it is formed from an appropriate electrically conductive material and in particular from metal. The printed circuit board 10 has a system earth which is isolated from the housing by not being directly connected thereto. The center-conductor part 16 is for example capacitively connected to the printed signal conductors 12 by means of capacitors 28.

The outer-conductor part 18 is isolated from the housing 14 by not being directly connected thereto, i.e. the HF plug or socket connector extends through the opening 22 without the outer-conductor part 18 being in direct electrical (physical) contact with the housing 14. In accordance with the invention, the housing 14 is drawn inwards in the region of the opening 22 in a tunnel-like form to form a screening sleeve 24 and the HF plug or socket connector extends through the screening sleeve 24. This being the case, the screening sleeve 24 is capacitively connected to the outer-conductor part 18 of the HF plug or socket connector via capacitors 26, at points which are spaced apart from one another. Direct currents (dc) from the outer-conductor part 18 to the housing 14, or rather to the screening sleeve 24, are prevented in this way, high-frequency signals being short-circuited across the capacitors at the same time. Nor are higher order modes able to get across the tunnel formed by the screening sleeve 24 because they decay exponentially. All in all, despite the physical gap which exists between the screening sleeve 24 and the outer-conductor part 18, high-frequency signals are thus unable to penetrate through the opening 22, and HF is thus unable to pass out of the interior of the housing to the outside or to pass into the housing from the outside.

A second preferred embodiment of circuit arrangement according to the invention is shown in various views in FIGS. 2 to 5, parts which perform the same function being identified by the same reference numerals in FIGS. 2 to 5 as in FIG. 1, the reader's attention therefore being directed to the above description of FIG. 1 for an explanation of the parts concerned. As well as being from different angles, the various views in FIGS. 2 to 5 also differ from one another in that, to give a clearer view of components which would otherwise be hidden, the printed circuit board has been omitted in FIGS. 4 and 5, and in FIG. 5 the center-conductor part 16 and the printed signal conductor 12 have been omitted as well. In FIGS. 2 to 5, the signal cable 20 is merely indicated schematically. Also, for reasons of clarity, the capacitors 26 which connect the outer-conductor part 18 to the screening sleeve 24 capacitively have not been shown.

As can be seen from FIGS. 2 to 5, the screening sleeve 24 is formed from a first U-shaped component 30 and first metallization 32 on the printed circuit board 10, with the first metallization 32 being arranged on a side of the printed circuit board 10 which is remote from the first U-shaped component 30. The first U-shaped component 30 and the first metallization 32 are connected together electrically by first through-contacts 34 (see FIGS. 4 and 5) in the printed circuit board 10. Arranged on the printed circuit board 10, on the same side as the first metallization 32, is second metallization 36 which forms the system earth of the printed circuit board 10 and which is isolated from the first metallization 32 and the housing 14 by not being directly connected thereto. This system earth 36 is also isolated from the outer-conductor part 18 by not being directly connected thereto.

That section of the outer-conductor part 18 which is situated within the screening sleeve 24, 30, 32 is formed by a second U-shaped component 38 and a metal layer 40 inside the printed circuit board 10, there being arranged in the printed circuit board 10 second through-contacts 42 (see FIG. 5) which connect the second U-shaped component 38 and the metal layer 40 together electrically by being directly connected thereto. All in all, the arrangement of the metal layer 40, the first and second U-shaped components 30, 38 and the first metallization 32 is such that the screening sleeve 24 formed by the first U-shaped component 30 and the first metallization 32 surrounds the section of the outer-conductor part 18 which is formed by the second U-shaped component 38 and the metal layer 40. This being the case, the center-conductor part 16, the outer-conductor part 18, and the screening sleeve 24 form a tri-axial arrangement.

The first U-shaped component 30 of the screening sleeve 24 is directly connected electrically to the housing 14, by being directly connected thereto, by means of resilient contact tongues 44. The metal layer 40 and the first metallization 32 on the other hand are electrically isolated from one another by not being directly connected to one another.

Figure 4:
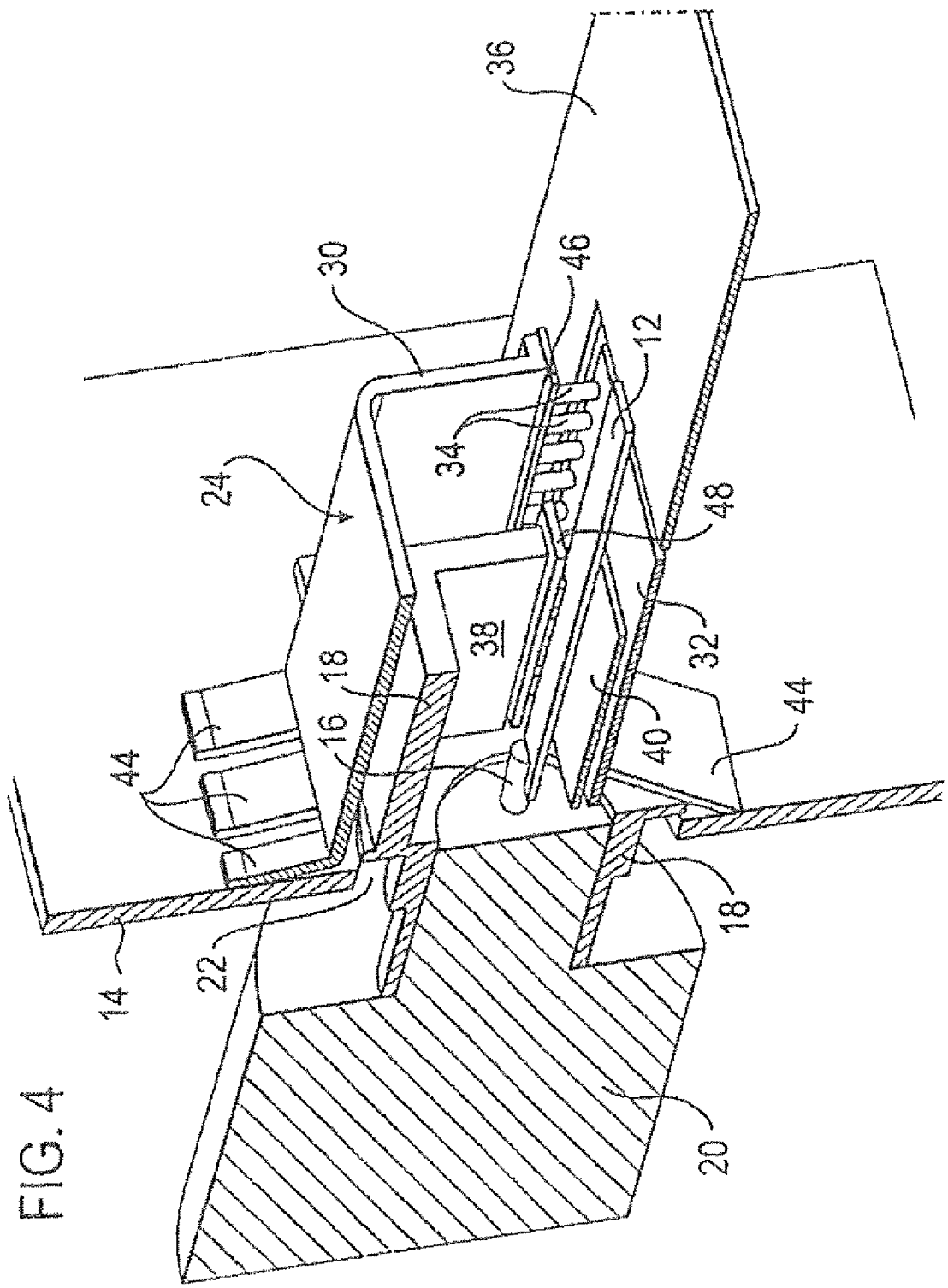
FIG. 4 is a further perspective view in section of the second preferred embodiment of circuit arrangement according to the invention as shown in FIG. 2, with the printed circuit board omitted.
Figure 5:
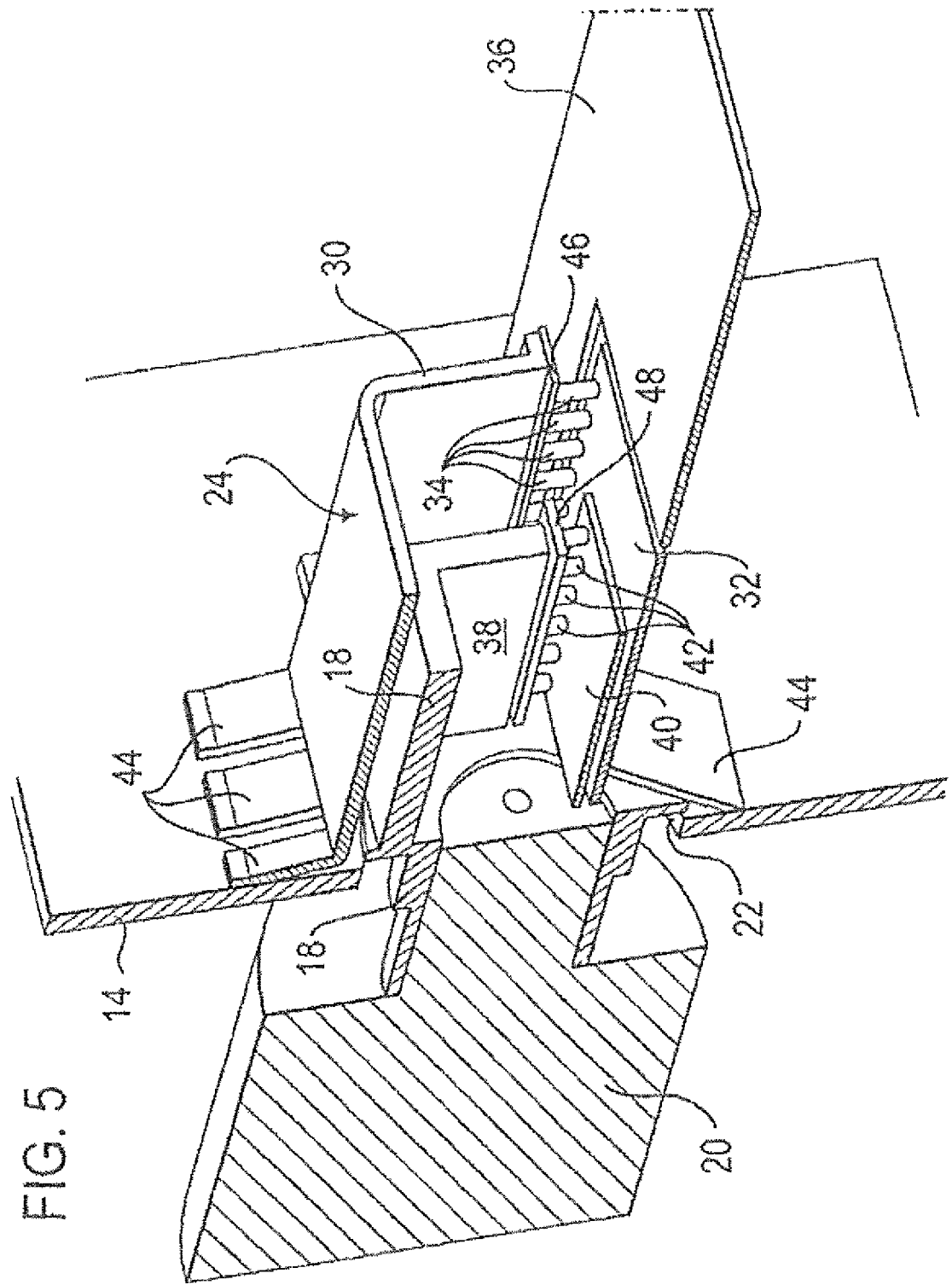
FIG. 5 is a further perspective view in section of the second preferred embodiment of circuit arrangement according to the invention as shown in FIG. 2, with the printed circuit board and the center-conductor part omitted.
Figure 6:
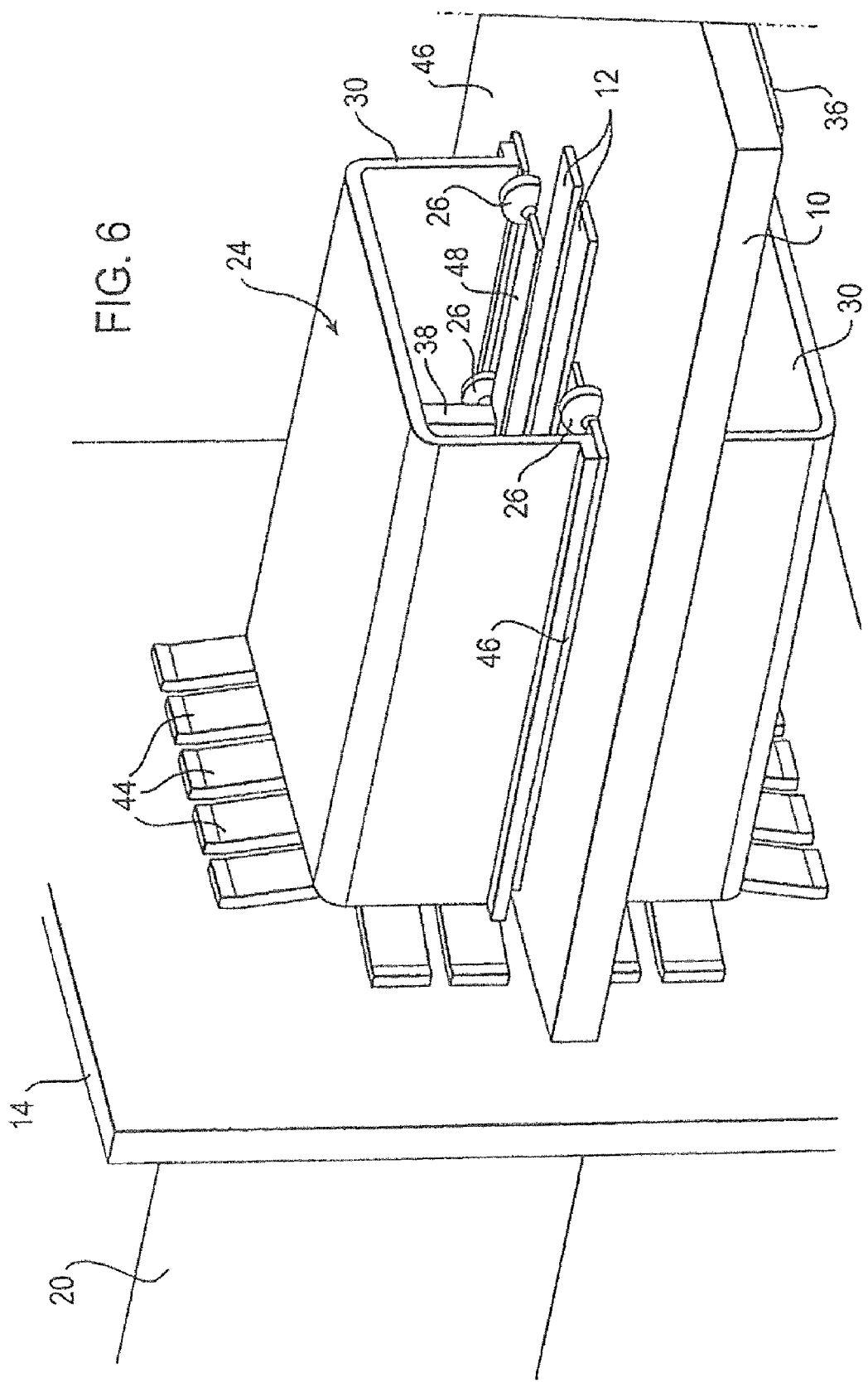
FIG. 6 is a perspective view in section of a third preferred embodiment of circuit arrangement according to the invention.
Figure 7:
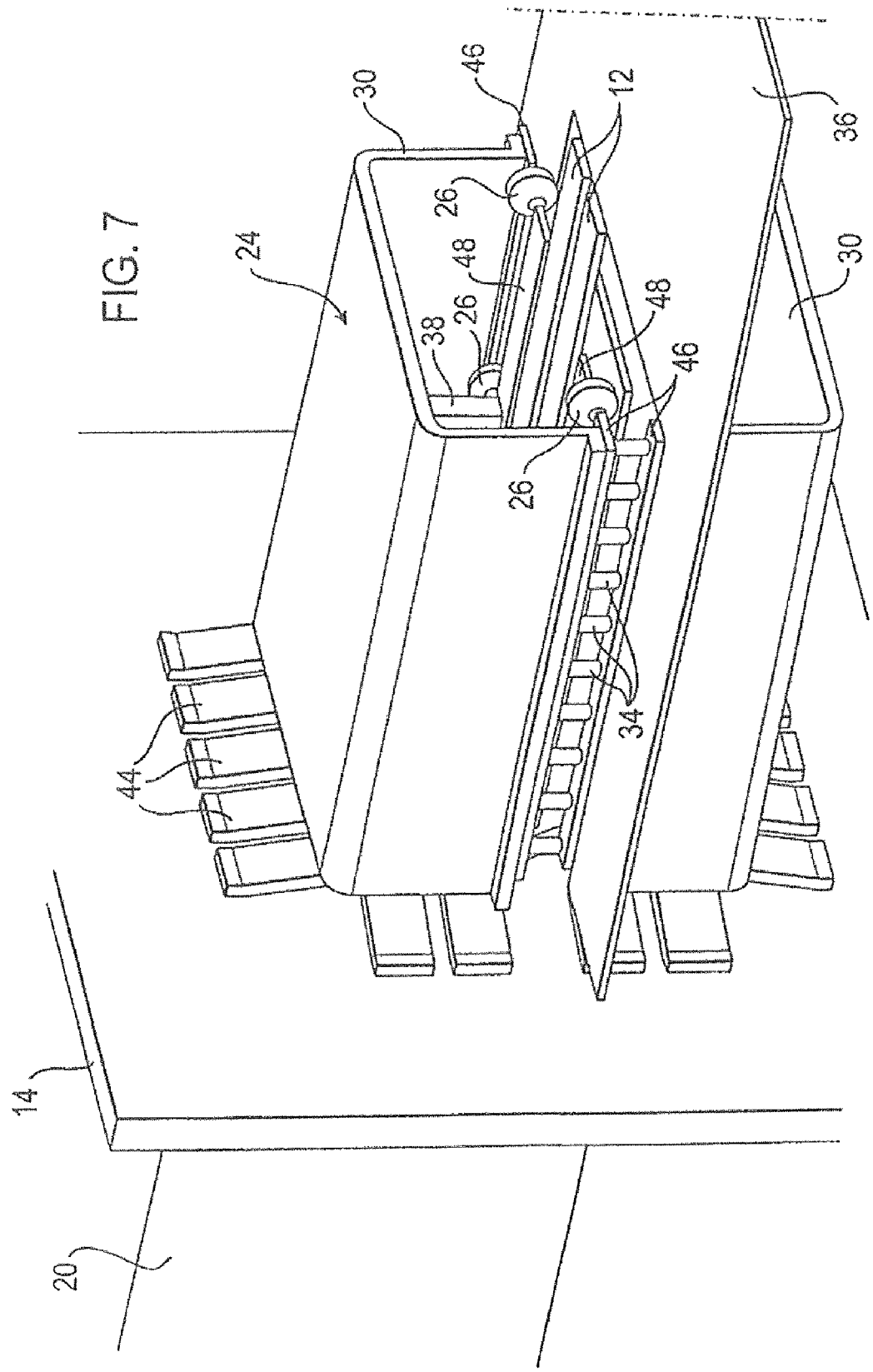
FIG. 7 is a further perspective view in section of the third preferred embodiment of circuit arrangement according to the invention as shown in FIG. 6, with the printed circuit board omitted.

As can be seen in particular from FIGS. 4 and 5, the U-shaped components 30 and 38 are seated on respective contact strips 46 and 48, which are connected in turn to the first and second through-contacts 34 and 42 respectively. The capacitive connection between the outer-conductor part 18 and the screening sleeve 24 is made for example, by means of the capacitors (not shown in FIGS. 4 and 5), via these contact strips 46 and 48, the capacitors each being connected to the contact strip 46 by one end and to the other contact strip 48 by the given other end. A plurality of capacitors is preferably provided, which are spaced away from one another in the axial direction of the HF plug or socket connector.

FIGS. 6 to 9 show various views of a third preferred embodiment of circuit arrangement according to the invention, parts which perform the same function being identified by the same reference numerals in FIGS. 6 to 9 as in FIGS. 1 to 5, the reader's attention therefore being directed to the above description of FIG. 1 to 5 for an explanation of the parts concerned. In contrast to the second preferred embodiment shown in FIGS. 2 to 5, in the third preferred embodiment the screening sleeve is formed by two first U-shaped components 30 which are arranged on opposite sides of the printed circuit board 10. The metallization 32 claimed for the second embodiment is not present. The two first U-shaped components 30 are connected together electrically in the printed circuit board 10 via the first through-contacts 34 (see FIGS. 7 to 9). The arrangement of the two first U-shaped components 30 on two sides of the printed circuit board 10 gives even greater blocking attenuation.

As an alternative, the outer-conductor part 18 is connected to the system earth 36 by direct connection or merely capacitively. This connection may however be entirely dispensed with if the signal transmitted via the two signal conductors 12 is a symmetrical signal, i.e. a signal whose summed current is zero, which means that no current flows via the system earth.

The capacitive connection between the outer-conductor part 18 and the screening sleeve 24 may be made by means of four, six, eight or more capacitors 26 which are spaced apart from one another. In the embodiments shown these are arranged in pairs but this need not necessarily be the case. The capacitors 26 preferably form a distributed structure which acts electrically as a low-pass filter.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. Circuit arrangement having an electronic circuit arranged on a printed circuit board having a housing which surrounds and electrically screens the printed circuit board, there being arranged on the printed circuit board an HF plug or socket connector which is connected to the electronic circuit and includes an outer-conductor part and a center-conductor part, with the HF plug or socket connector passing through an opening in the housing, the outer-conductor part of the HF plug or socket connector including being isolated from the housing by not being directly connected thereto, the HF plug or socket connector including a screening sleeve being provided which at least partly surrounds the outer-conductor part in a tunnel-like form both in the axial direction and also in the circumferential direction and which is directly connected to the housing and includes a capacitive connection to the outer-conductor part of the HF plug or socket connector.

2. The circuit arrangement of claim 1 wherein the printed circuit board includes a system earth which is isolated from the housing by not being directly connected thereto.

3. The circuit arrangement of claim 1 wherein the center-conductor part includes a direct or capacitive connection to at least one printed signal conductor of the electrical circuit on the printed-circuit board.

4. The circuit arrangement of claim 3, wherein the capacitive connection between the screening sleeve and the outer-conductor part of the HF plug or socket connector comprises a plurality of capacitors which are each connected on the one hand to the screening sleeve and on the other hand to the outer-conductor part of the HF plug or socket connector while being spaced away from one another.

5. The circuit arrangement of claim 4 wherein the screening sleeve comprises at least two first U-shaped components which are arranged on opposite sides of the printed circuit board, the first U-shaped components being connected to one another by first through-contacts which pass through the printed circuit board.

6. The circuit arrangement of claim 3 including having the screening sleeve in the form of a tunnel-like folding-round of the housing.

7. The circuit arrangement of claim 3 wherein the screening sleeve comprises at least two first U-shaped components which are arranged on opposite sides of the printed circuit board, the first U-shaped components being connected to one another by first through-contacts which pass through the printed circuit board.

8. The circuit arrangement of claim 1 wherein the capacitive connection between the screening sleeve and the outer-conductor part of the HF plug or socket connector comprises a plurality of capacitors which are each connected on the one hand to the screening sleeve and on the other hand to the outer-conductor part of the HF plug or socket connector while being spaced away from one another.

9. The circuit arrangement of claim 1 wherein the center-conductor part of the HF plug or socket connector includes two signal conductors.

10. The circuit arrangement of claim 9 wherein the screening sleeve comprises at least one first U-shaped component and at least one first metallization which is applied to a side of the printed circuit board which is remote from the first U-shaped component, the first U-shaped component being connected to the first metallization by first through-contacts which pass through the printed circuit board.

11. The circuit arrangement of claim 10 wherein the printed circuit board includes, on one side, at least one second metallization which forms the system earth of the printed circuit board and which is isolated from the first metallization by not being directly connected thereto.

12. The circuit arrangement of claim 11, wherein the outer-conductor part of the HF plug or socket connector includes being at least partly formed by at least one second U-shaped component and at least one metal layer formed in the printed circuit board, the second U-shaped component being connected to the metal layer by through-contacts arranged in the printed circuit board and the metal layer being so arranged in the printed circuit board that it is arranged between the first metallization and the first U-shaped component of the screening sleeve.

13. The circuit arrangement of claim 10 wherein the outer-conductor part of the HF plug or socket connector includes being at least partly formed by at least one second U-shaped component and at least one metal layer formed in the printed circuit board, the second U-shaped component being connected to the metal layer by through-contacts arranged in the printed circuit board and the metal layer being so arranged in the printed circuit board that it is arranged between the first metallization and the first U-shaped component of the screening sleeve.

14. The circuit arrangement of claim 1 including having the screening sleeve in the form of a tunnel-like folding-round of the housing.

15. The circuit arrangement of claim 1 wherein the screening sleeve comprises at least one first U-shaped component and at least one first metallization which is applied to a side of the printed circuit board which is remote from the first U-shaped component, the first U-shaped component being connected to the first metallization by first through-contacts which pass through the printed circuit board.

16. The circuit arrangement of claim 1 wherein the screening sleeve comprises at least two first U-shaped components which are arranged on opposite sides of the printed circuit board, the first U-shaped components being connected to one another by first through-contacts which pass through the printed circuit board.

17. The circuit arrangement of claim 16 wherein the outer-conductor part of the HF plug or socket connector is at least partly formed by at least one second U-shaped component and at least one metal layer formed in the printed circuit board, the second U-shaped component being connected to the metal layer by second through-contacts arranged in the printed circuit board and the metal layer being so arranged in the printed circuit board that it is arranged between the first U-shaped components of the screening sleeve.

18. The circuit arrangement of claim 16 wherein the printed circuit board includes, on one side, at least one second metallization which forms a system earth for the printed circuit board and which is isolated from the first U-shaped components by not being directly connected thereto.

19. The circuit arrangement of claim 1 including having the HF plug or socket connector designed for connection to a plug or socket connector on a signal cable at an end which is remote from the printed circuit board and which projects out of the housing.

* * * * *